(12) United States Patent
Goto et al.

(10) Patent No.: US 8,043,706 B2
(45) Date of Patent: Oct. 25, 2011

(54) INORGANIC COMPOSITION ARTICLE

(75) Inventors: Naoyuki Goto, Kanagawa (JP);
Toshitaka Yagi, Kanagawa (JP)

(73) Assignee: Ohara Inc., Kanagawa (JP)

( * ) Notice: Subject to any disclaimer, the term of this patent is extended or adjusted under 35 U.S.C. 154(b) by 535 days.

(21) Appl. No.: 12/078,639

(22) Filed: Apr. 2, 2008

(65) Prior Publication Data
US 2008/0248316 A1    Oct. 9, 2008

(30) Foreign Application Priority Data

Apr. 6, 2007   (JP) .................................. 2007-101180

(51) Int. Cl.
*B32B 9/00*   (2006.01)
*C03C 10/14*  (2006.01)

(52) U.S. Cl. ........ 428/426; 428/446; 428/702; 428/432; 501/4

(58) Field of Classification Search ........................ None
See application file for complete search history.

(56) References Cited

U.S. PATENT DOCUMENTS

| | | | |
|---|---|---|---|
| 3,637,453 A | | 1/1972 | Simmons |
| 3,873,329 A | | 3/1975 | Beall |
| 3,907,577 A | | 9/1975 | Kiefer et al. |
| 4,455,160 A | | 6/1984 | Rittler |
| 4,608,348 A | * | 8/1986 | Beall et al. .................... 501/3 |
| 4,726,981 A | | 2/1988 | Pierson et al. |
| 4,853,349 A | * | 8/1989 | Martin .............................. 501/8 |
| 4,859,636 A | | 8/1989 | Aratani et al. |
| 5,691,256 A | * | 11/1997 | Taguchi et al. ................ 501/63 |

FOREIGN PATENT DOCUMENTS

| | | |
|---|---|---|
| EP | 0 788 093 A1 | 8/1997 |
| EP | 1 219 574 A1 | 7/2002 |
| GB | 1076894 | 7/1967 |
| GB | 1118139 | 6/1968 |
| GB | 1375097 | 11/1974 |
| GB | 2 234 968 A | 2/1991 |
| JP | 47-49299 | 12/1972 |
| JP | 49-099521 | 9/1974 |
| JP | 50-38719 | 4/1975 |
| JP | 59-116150 | 7/1984 |
| JP | 60-129294 | 7/1985 |
| JP | 61-286245 | 12/1986 |
| JP | 3-029103 A | 2/1991 |
| JP | 3-46308 | 2/1991 |
| JP | 05-070174 | 3/1993 |
| JP | 07-309636 A | 11/1995 |
| JP | 10-226532 | 8/1998 |
| JP | 2000-344544 A | 12/2000 |
| JP | 2002-174810 A | 6/2002 |
| JP | 2004-099370 A | 4/2004 |
| JP | 2005-037906 | 2/2005 |
| JP | 2005-089272 A | 4/2005 |
| JP | 2006-062929 | 3/2006 |
| JP | 2007-031180 | * 2/2007 |
| KR | 2001-0077899 A | 8/2001 |

OTHER PUBLICATIONS

Translation of JP-2002-174810.*
Translation of JP-2007-031180.*
Australian Search Report SG-200802544-7 filed Apr. 1, 2008.
Notice of Reasons for Rejection issued to JP Application No. 2007-101180, mailed Nov. 10, 2009.
Notice of Reasons for Rejection issued to Korean Application No. 10-2008-0024674 mailed Aug. 25, 2010.

* cited by examiner

*Primary Examiner* — Ling Xu
(74) *Attorney, Agent, or Firm* — Hoffmann & Baron, LLP

(57) ABSTRACT

An inorganic composition article used in disk substrate for information recording media, with a low melting point and a high productivity, combining superior surface characteristics capable of sufficiently dealing with a ramp load system for high density recording in both an in-plane magnetic recording system and a perpendicular magnetic recording system, having a high mechanical strength capable of enduring high speed rotation and impact, and combining both a heat expansion characteristic and heat resistance corresponding to each drive component. The inorganic composition articles contain a $Li_2O$ component and an $Al_2O_3$ component, with the percent by mass ratio of $Li_2O$ to $Al_2O_3$ ($Li_2O/Al_2O_3$) being at least 0.3, include crystals, and have a compressive stress layer arranged on a surface.

17 Claims, No Drawings

INORGANIC COMPOSITION ARTICLE

This application is based on and claims the benefit of priority from Japanese Patent Application No. 2007-101180, filed on 6 Apr. 2007, the content of which is incorporated herein by reference.

BACKGROUND OF THE INVENTION

1. Field of the Invention

The present invention relates to an inorganic composition article having superior mechanical strength and capable of reducing the elution of alkali ions from the article by providing a compressive stress layer on the article surface. In particular, with regard to substrates for a magnetic recording medium used in various information magnetic recording devices, and among them, especially to a perpendicular magnetic recording medium, the invention relates to a substrate for a disk-shaped information recording medium having surface super-smoothness, washability and high strength. Herein, in the present invention, "information recording media" refer to information magnetic recording media usable in a fixed mount type hard disk used as a hard disk in personal computers, removable type hard disks or card type hard disks, hard disks for digital video cameras, digital cameras or audio equipment, a hard disk for mobile (cellular) phones or hard disks for various electronic devices.

2. Related Art

In recent years, in order to deal with the application of personal computers to multimedia and also the trend towards handling large amounts of data, such as in animation and speech in digital video cameras and digital cameras, information magnetic recording devices of high capacity have become necessary. As a result, in order to increase surface recording density, information magnetic recording media tend to increase the density of bits and tracks while reducing bit cell size. Therefore, a magnetic head is required to operate more closely to the disk surface.

Furthermore, when the recording density exceeds 100 $Gb/in^2$, the recording becomes thermally unstable in such a small magnetization unit, so that the in-plane recording system reaches a physical limitation with regard to the demand for high recording density exceeding 100 $Gb/in^2$.

In order to cope with this difficulty, the perpendicular magnetic recording system has been employed. Since this perpendicular magnetic recording system has an easy magnetization axis in the perpendicular direction, bit size can be extremely small, and also since this system has a desired medium film thickness (5 to 10 times the in-plane recording system), the demagnetizing field can be reduced and a shape magnetic anisotropic effect can be anticipated. Therefore, this system is able to solve problems such as reduction in recording energy and thermal instability occurring with high density in conventional in-plane recording systems, so as to realize tremendous improvement in recording density compared with the in-plane magnetic recording system. Thus, in the perpendicular magnetic recording system, it has already become possible to achieve a recording density of no less than 100 $Gb/in^2$ on a practical level in mass production, and research on recording densities exceeding 300 $Gb/in^2$ is already being carried out.

In recent information magnetic recording devices, the magnetic head performs CSS (contact•start•stop) motion repeating movements to contact the disk substrate of the information magnetic recording medium before starting the device and float up from the disk substrate when starting a device. In this case, when the contact surface between them is a mirror-finished surface of a more than necessary level, problems occur such as a unsmooth rotation start or damage to an information magnetic recording medium surface caused by an increase in the friction coefficient due to adsorption. Thus, there are conflicting demands regarding the disk substrate of an information magnetic recording medium for keeping the magnetic head floating as low as possible with the increase in the recording capacity, and preventing the magnetic head from sticking to the information magnetic recording medium disk substrate. To cope with these conflicting demands, the development of a landing region technique to produce a starting and stopping unit for the magnetic head in the specific region of the disk substrate of information magnetic recording medium has been promoted.

On the other hand, competing with the aforementioned landing region technique, there has also been developed a ramp loading technique (contact recording of the magnetic head) in which the magnetic head is completely in contact with the substrate so as to remove the starting and stopping of the magnetic head from the information magnetic recording medium, so that unevenness of the substrate surface to prevent the magnetic head from sticking to the disk substrate has become unnecessary. Therefore, by making the substrate surface super-smooth, it has become possible to operate the magnetic head extremely close to the information recording medium surface enabling the bit cell size to be reduced, thereby enabling the recording density to be raised.

Furthermore, also in the perpendicular magnetic recording medium, the magnetic head floating height tends to be as low as 15 nm or less, as the recoding density improves, so that the recording system further tends to become near-contact recording or contact recording. On the other hand, in order to effectively utilize the medium surface as a data region, conventional systems to provide the landing region have been replaced by a ramp loading system with a no landing region. Therefore, the data region of the disk surface or the entire substrate surface must be super-smooth so as to enable the magnetic head floating height to be reduced and enable the contact recording to be performed.

Furthermore, with the improvement of recording density, high precision is needed in positioning the magnetic head and recording medium, so that high dimensional accuracy is required for each component of the disk substrate and magnetic information recording device. Since the effects of the difference of mean linear expansion coefficients on these components becomes significant, it is necessary to make the difference of these mean linear expansion coefficients as small as possible. More strictly, the mean linear expansion coefficient of the disk substrate is often preferably very slightly larger than the mean linear expansion coefficients of these components. Components having a mean linear expansion coefficients in the range of +90~+100 ($\times 10^{-7}$.° $C.^{-1}$) are often used in small magnetic information recording media in particular, and it has been considered that the thermal expansion coefficient in this range is also necessary for the disk substrate, so that there has been a disadvantage such as the occurrence of a write error when the thermal expansion coefficient deviates slightly.

Since in this perpendicular magnetic recording system, magnetization is performed perpendicularly to the medium surface, a medium having the easy magnetization axis in the perpendicular direction is used that is different from a conventional medium having the easy magnetization axis in the in-plane direction. Materials which have been studied and put to practical use as a recording layer of the perpendicular magnetic recording system are Co base alloys such as CoCrPt, CoCrPt—Si and CoCrPt—$SiO_2$, and an Fe base alloy such as FePt.

However, the film formation temperature for the miniaturization of magnetic substance crystalline particles and production in the perpendicular direction of magnetic recording media such as FePt and other oxide based media have to be raise. Furthermore, according to recent research, annealing may be performed in some cases at high temperature (in the range of 300 to 900° C.) to improve magnetic property. Therefore, the substrate material must be one capable of resisting such high temperatures and should not generate substrate deformation, alteration of the surface roughness, etc.

Furthermore, these magnetic recording medium substrates must have no crystal anisotropy, foreign substances, impurities and so on, which might affect the film forming medium crystal and their composition must be dense, homogeneous and fine, and also must have chemical durability capable of enduring washing and etching with various chemicals.

Furthermore, in order to attempt the expediting of information recording and reading, technical development has been promoted by rotating the information magnetic recording medium disk of the magnetic recording device at high speed. However, the high speed rotation causes deflection and deformation of the substrate, so that the substrate material is required to have high mechanical strength. In addition, in contrast to the current fixed mount type information magnetic recording device, information magnetic recording devices using a removable disk system and card system are in the stage of investigation and practical application, and also since the application development for digital video cameras, digital cameras, and so on has started, these demands have increased more and more.

Although aluminum alloy is mostly used in conventional magnetic disk substrate material, a substrate made of aluminum alloy is apt to produce irregularity in the shape of protrusions or spots on the substrate surface so as to be difficult to obtain a substrate having sufficient flatness and smoothness. In addition, since aluminum alloy is a soft material and apt to be deformed, it is difficult be adapted to the trend to make devices thinner. Furthermore, aluminum alloy has problems such as the occurrence of head clash due to deflection during high speed rotation leading to damage of the medium, so that it is not a material capable of sufficiently adapting to high density recording in future. In addition, since the allowable temperature limit of aluminum alloy during the film formation, which becomes most important in the magnetic recording system, is less than 300° C., the substrate is thermally-deformed if the film formation is performed at higher than 300° C., and annealing is carried out at high temperatures such as 500° C. to 900° C. Therefore, it is difficult to apply a substrate made of aluminum alloy to the substrate for magnetic recording medium requiring such a high temperature treatment.

As a material to resolve these problems of aluminum alloy substrate, there are amorphous glass substrates, chemical reinforced glass substrates, crystallized glass substrates and so on having high hardness and superior impact strength.

As the amorphous glass substrate and chemical reinforced glass substrate, there are known the chemical reinforced soda lime glass ($SiO_2$—CaO—$Na_2O$) and aluminosilicate glass ($SiO_2$—$Al_2O_3$—$Na_2O$), but the heat resistance of the substrate itself is low because they are amorphous glasses. That is, there are problems of deformation after the medium film formation where flatness degrades after the film of magnetic recording medium is formed on these substrates at the temperature above 300° C. Furthermore, the above low heat resistance can become the source of problems such as the elution of alkaline components from the inside of the film to cause damage thereto.

While the crystallized glass substrate is superior to other amorphous glass substrates and chemical reinforced glass substrates in Young's modulus and hardness, and concerning the impact strength and ring bending strength, sufficiently fulfills characteristics required as an information magnetic recording device for practical use, it is inferior to an amorphous glass substrate subjected to the chemical reinforcement treatment.

Although the crystallized glass is one in which crystals are precipitated inside by heating amorphous glass of the specific composition and is known to be superior to amorphous glass in its superior mechanical strength, it has been attempted to subject the crystallized glass to the chemical reinforcement treatment so as to further improve its strength. (For example, see Patent documents Japanese Unexamined Patent Application, First Publication No. 2005-37906, Japanese Unexamined Patent Application, First Publication No. Sho61-286245, Japanese Unexamined Patent Application, First Publication No. Hei 05-70174, Japanese Unexamined Patent Application, First Publication No. Sho 49-99521, Japanese Unexamined Patent Application, First Publication No. Sho 59-116150, Japanese Unexamined Patent Application, First Publication No. 2006-62929, Unexamined Patent Application, First Publication No. Hei 10-226532, Unexamined Patent Application, First Publication No. Sho 50-38719 and Unexamined Patent Application, First Publication No. Sho 47-49299, etc.) However, no crystallized glass preferable for application to the magnetic recording medium substrate demanded in recent years has been found.

Although the crystallized glass of $Li_2O$—$Al_2O_3$—$SiO_2$ base disclosed in Japanese Unexamined Patent Application, First Publication No. 2005-37906 has β-spodumene (β-$Li_2Al_2Si_4O_{12}$) as a crystalline phase and its strength is increased by undergoing the chemical reinforcement treatment after precipitating the crystalline phase, it is not preferable as an information recording medium substrate, because its precipitated crystals are material having a negative thermal expansion coefficient. Furthermore, its application is limited to the reflection mirror.

Furthermore, although $Na_2O$—$Al_2O_3$—$SiO_2$ base crystallized glass disclosed in Japanese Unexamined Patent Application, First Publication No. Sho61-286245 and $Li_2O$—$Al_2O_3$—$SiO_2$ base crystallized glass disclosed in Japanese Unexamined Patent Application, First Publication No. Hei05-70174 have a β-quartz (β-$SiO_2$) solid solution as a crystalline phase, $Li_2O$—$Al_2O_3$—$SiO_2$ base crystallized glass disclosed in Japanese Unexamined Patent Application, First Publication No. Sho49-99521 and Japanese Unexamined Patent Application, First Publication No. Sho59-116150 have a β-quartz (β-$SiO_2$) solid solution and/or β-spodumene (β-$Li_2Al_2Si_4O_{12}$) as the crystalline phase, they are not preferable as the information recording medium substrate, because their precipitated crystals are materials having a negative thermal expansion coefficient. In addition, they have not been discussed for the crystalline particle diameter, Young's modulus and specific gravity.

Furthermore, although Japanese Unexamined Patent Application, First Publication No. 2006-62929 discloses $SiO_2$—$Na_2O$—$B_2O_3$—$Al_2O_3$ base crystallized glass precipitating crystals of forsterite (2 MgO/$SiO_2$) and/or gahnite (ZnO.$Al_2O_3$) as the crystalline phase, its crystal-volume ratio is as high as more than 70%, so that it is difficult to polish the surface roughness after abrasive grinding. In addition, its application is limited to top plates for buildings and cooking utensils.

Although Unexamined Patent Application, First Publication No. Hei10-226532 discloses the chemical reinforcement substrate by ion exchange of $SiO_2$—$Li_2O$—$Al_2O_3$ base crystallized glass and $Li_2O$—$Al_2O_3$—$SiO_2$ base amorphous glass precipitating at least one kind of lithium disilicate ($Li_2Si_2O_5$) and/or spodumene ($Li_2Al_2Si_4O_{12}$), no example concerning the chemical reinforcement of crystallized glass is cited.

In addition, although $MgO$—$Al_2O_3$—$SiO_2$ based crystallized glass disclosed in Unexamined Patent Application, First Publication No. Sho50-38719 has mixed crystals of α-quartz (α-$SiO_2$) and sapphirine (4 $MgO.5Al_2O_3.SiO_2$) or β-quartz (β-eucryptite solid solution), its crystal amount is as high as 75% by weight, so that it is difficult to polish the surface roughness after grinding. Furthermore, the glasses are not discussed concerning the described below Young's modulus, specific gravity, crystalline particle diameter and crystallization ratio at all.

Unexamined Patent Application, First Publication No. Sho 47-49299 discloses the reinforcement of crystallized glass containing the crystalline phase selected from the group consisting of β-eucryptite ($Li_2O.Al_2O_3.2SiO_2$), β-spodumene ($Li_2O.Al_2O_3.4SiO_2$), nepheline ((Na, K)$AlSiO_4$), carnegieite ($Na_2O.Al_2O_3.2SiO_2$) and β-quartz (β-$SiO_2$), but among the precipitated crystals, those containing β-eucryptite, β-spodumene and β-quartz are materials having a negative thermal expansion coefficient, are not preferable as the information recording medium substrate. Furthermore, when the crystallized glass contains nepheline and carnegieite, it does not include lithium as a component, which can be effective in the chemical reinforcement and further requires a temperature as high as 590 to 730° C. for the chemical reinforcement, so that it is not preferable as a substrate for the information recording medium. In addition, the glasses are not discussed concerning the below described Young's modulus, specific gravity, crystalline particle diameter and crystallization ratio at all.

SUMMARY OF THE INVENTION

An objective of the present invention is to provide an inorganic composition article superior in the mechanical strength and chemical resistance, especially an inorganic composition article used in the disk substrate for information recording media having a low melting point and a high productivity, capable of dealing with the design improvement (design upgrade) of magnetic information recording devices as described above, and having superior surface characteristics capable of sufficiently dealing with the ramp load system for high density recording in both the in-plane magnetic recording system and perpendicular magnetic recording system, having high mechanical strength capable of enduring high speed rotation and dropping impact, and combining both the thermal expansion characteristic and heat resistance corresponding to each drive component.

As a result of considerable research and tests conducted by the inventors of the present invention in order to achieve the above object, the inventors have found that an inorganic composition containing an $Li_2O$ component and $Al_2O_3$ component in the percent by mass ratio of $Li_2O$ to $Al_2O_3$ ($Li_2O/Al_2O_3$) of no less than 0.3, containing crystals and provided with a compressive stress layer on the surface can yield a markedly advantageous inorganic composition article as compared with the conventional inorganic composition article in view of the aforementioned object, thereby achieving the present invention. Furthermore, the inventors have found that the inorganic composition article of the present invention has high mechanical strength capable of dealing with the high speed rotation of information recording devices and a superior impact resistance property for mobile applications, and furthermore combines a heat expansion property capable of readily compatible with drive components, so that it can provide a far more advantageous substrate when compared with the substrate used in the conventional information recording media, etc. In this case, crystals to be contained are preferably at least one kind selected from the group consisting of lithium monosilicate, lithium disilicate, α-quartz, α-quartz solid solution, α-cristobalite and α-cristobalite solid solution. These crystals are ones which are superior in the extreme smoothness of the abrasive finishing surface by controlling the crystalline particle precipitation amount and crystallization degree. Especially, the disk substrate and so on for information recording media using inorganic compositions such as crystallized glasses in order to achieve the object of the present invention are preferable for use in the ramp load system. Furthermore, they are in a crystalline phase preferable especially for obtaining the aforementioned desired mean linear expansion coefficient. More specifically, the present invention provides the followings.

In a first aspect, an inorganic composition article contains a $Li_2O$ component and $Al_2O_3$ component in terms of oxides with the percent by mass ratio of $Li_2O$ to $Al_2O_3$ ($Li_2O/Al_2O_3$) being no less than 0.3, including crystals, and has a compressive stress layer set up on the surface.

In a second aspect, the inorganic composition article according to the first aspect includes as a crystalline phase any one selected from the group consisting of lithium monosilicate, lithium disilicate, α-quartz, α-quartz solid solution, α-cristobalite and α-cristobalite solid solution.

In a third aspect of the inorganic composition article according to the first or second aspect, the compressed stress layer is formed by replacing ions contained in the surface layer with cations having larger ion radius than the ions.

In a fourth aspect of the inorganic composition article according to any one of the first to third aspects, the compressive stress layer is formed by heating and subsequently rapidly cooling the article.

In a fifth aspect of the inorganic composition article according to any one of the first to fourth aspects, the compressive stress layer is formed by the ion implantation.

In a sixth aspect of the inorganic composition article according to any one of the first to fifth aspects, the content of particles showing the crystalline phase is no more than 70% in terms of percent by mass (no more than 70 percent by mass).

In a seventh aspect of the inorganic composition article according to any one of the first to sixth aspects, the mean particle diameter of the particles showing the crystalline phase is no more than 1 μm.

In an eighth aspect of the inorganic composition article according to any one of the first to seventh aspects, supposing that the elution amount of alkali metallic ion of the article provided with the compressive stress layer in a water bath is A, and the elution amount of an alkali metallic ion of the article previously provided with the compressive stress layer in a water bath is B, A/B is <1.

In a ninth aspect of the inorganic composition article according to any one of the first to eighth aspects, the composition of the inorganic composition article before the compressive stress layer is set up includes the following (respective) components in percent by mass in terms of oxides, $SiO_2$: 50% to 90%,
$Li_2O$: more than 4% and no more than 15%, and
$Al_2O_3$: 2% to 20%.

In a tenth aspect of the inorganic composition article according to the ninth aspect, the composition of the inor ganic composition article before the compressive stress layer is set up includes the following (respective) ingredients, MgO: 0% to 3%,
ZnO: 0% to 10%,
CaO: 0% to 7%,
BaO: 0% to 7%,
SrO: 0% to 7%,
$P_2O_5$: 0% to 3%,
$ZrO_2$: 0% to 10%,
$TiO_2$: 0% to 5%,
$K_2O$: 0% to 3%,
$Na_2O$: 0% to 2%, and/or
at least one selected from a $Sb_2O_3$ component and $As_2O_3$ component: 0% to 2%.

In an eleventh aspect of the inorganic composition article according to any one of the first to tenth aspects, the inorganic composition is crystallized glass.

In a twelfth aspect, a crystallized glass substrate for information recording medium consists of the inorganic composition article according to any one of the first to eleventh aspects.

According to a thirteenth aspect, an information recording medium uses the crystallized glass substrate for information recording medium according to the twelfth aspect.

In a fourteenth aspect, an electronic circuit substrate consists of the inorganic composition article according to any one of the first to eleventh aspects.

In a fifteenth aspect, an electronic circuit uses the electronic circuit substrate according to the fourteenth aspect.

In a sixteenth aspect, a substrate for optical filter consists of the inorganic composition article according to any one of the first to eleventh aspects.

In a seventeenth aspect, an optical filter includes a dielectric multilayer film formed on the substrate for optical filter according to the sixteenth aspect.

In an eighteenth aspect, a method for producing an inorganic composition article includes steps of immersing an inorganic composition containing $Li_2O$ component and $Al_2O_3$ component in terms of oxides with the percent by mass ratio of $Li_2O$ to $Al_2O_3$ ($Li_2O/Al_2O_3$) being no less than 0.3, and adding crystals into the heated reinforcement treatment solution so as to replace ions contained in the surface layer of the inorganic composition with cations having larger ion radius than the ions, thereby setting up a compressive stress layer on the surface of the inorganic composition.

In a nineteenth aspect, a method for producing an inorganic composition article includes setting up a compressive stress layer on the surface of the inorganic composition by rapidly cooling after heating the inorganic composition containing a $Li_2O$ component and $Al_2O_3$ component in terms of oxides with the percent by mass ratio of $Li_2O$ to $Al_2O_3$ ($Li_2O/Al_2O_3$) of no less than 0.3, and adding crystals.

In a twentieth aspect, a method for producing an inorganic composition article includes setting up a compressive stress layer on the surface by performing ion implantation to the inorganic composition containing a $Li_2O$ component and $Al_2O_3$ component in terms of oxides with the percent by mass ratio of $Li_2O$ to $Al_2O_3$ ($Li_2O/Al_2O_3$) of no less than 0.3, and adding crystals.

According to a twenty-first aspect, in the method for producing an inorganic composition article according to any one of eighteenth to twentieth aspects, the inorganic composition contains as a crystalline phase of at least selected from the group consisting of lithium monosilicate, lithium disilicate, α-quartz, α-quartz solid solution, α-cristobalite and α-cristobalite solid solution.

According to a twenty-second aspect, in the method for producing an inorganic composition article according to any one of the eighteenth to twentieth aspects, the inorganic composition is crystallized glass obtained by melting and rapidly cooling the glass raw material to prepare raw glass, heat-treating the raw glass at 450° C. to 620° C. to perform the nuclear formation process, followed by the heat treatment at 620° C. to 800° C. to perform the crystal growing process after the nuclear formation process.

According to a twenty-third aspect, in the method for producing an inorganic composition article according to twenty-second aspect, the glass raw material contains the following (respective) components in percent by mass in terms of oxides:

$SiO_2$: 50% to 90%,
$Li_2O$: more than 4% and no more than 15%, and
$Al_2O_3$: 2% to 20%.

According to a twenty-fourth aspect, in the method for producing an inorganic composition article according to twenty-third aspect containing the following (respective) components in % mass in terms of oxides, MgO: 0% to 3%,
ZnO: 0% to 10%,
CaO: 0% to 7%,
BaO: 0% to 7%,
SrO: 0% to 7%,
$P_2O_5$: 0% to 3%,
$ZrO_2$: 0% to 10%,
$TiO_2$: 0% to 5%,
$K_2O$: 0% to 3%,
$Na_2O$: 0% to 2%, and/or
combined content of at least one selected from $Sb_2O_3$ component and $As_2O_3$ component: 0 to 2%.

Thus, the inorganic composition article of the present invention can dramatically improve the impact strength and ring bending strength desirable for substrates such as a disk substrate for information magnetic recording medium by forming the compressive stress layer so as to have achieved high mechanical strength and impact resistance property capable of enduring a high speed rotation. In addition, as the application of the inorganic composition article of the present invention, the present invention can provide a substrate which becomes capable of suppressing the elution of alkali ion therefrom with the formation of the compressive stress layer on the surface, and has superior surface roughness after the abrasive finishing so as to reduce the distance between the head and recording medium, especially a substrate preferable for the information recording medium, electronic circuit, optical filter, etc.

Herein below, a specific embodiment of the inorganic composition article of the present invention is explained.

DETAILED DESCRIPTION OF THE INVENTION

The inorganic composition article of the present invention is one containing a $Li_2O$ component and $Al_2O_3$ component in terms of oxides, with the percent by mass ratio of $Li_2O$ to $Al_2O_3$ ($Li_2O/Al_2O_3$) being no less than 0.3, including crystals, and having a compressive stress layer set up on the surface.

When the compressive stress layer is set up on the surface, and when the compressive stress is formed by the chemical reinforcement in particular, the $Li_2O$ component becomes essential. Furthermore, in order to form the inorganic composition stably and improve the ionic diffusion coefficient, the $Al_2O_3$ component is essential. Furthermore, in order to facilitate the compressive stress formation and dramatically increase the impact strength, the percent by mass ratio of $Li_2O$ to $Al_2O_3$ ($Li_2O/Al_2O_3$) is required to be no less than 0.3, more preferably no less than 0.4, and most preferably no less than 0.6. In addition, if the ratio is less than 0.3, β-spodumene and β-quartz solid solution become easy to precipitate, and when these crystals precipitate, it becomes difficult to obtain the mean expansion coefficient ($+50 \times 10^{-7 \cdot \circ} C.^{-1}$ to $+130 \times 10^{-7 \cdot \circ} C.^{-1}$) of the inorganic composition article, which is required in the present invention. On the other hand, when the ratio becomes large, that is, if the $Li_2O$ content increases extremely and the $Al_2O_3$ component content decreases, the chemical durability deteriorates, so that the upper limit of $Li_2O/Al_2O_3$ is preferably 5, more preferably 4, and most preferably 3.

Next, the compressive stress layer is described. Although the inorganic composition article of the present invention can obtain an advantage to further improve the mechanical strength, which the inorganic composition has before setting up the compressive stress layer by setting up the compressive stress layer on its surface, the advantage is further elevated by crystals that the inorganic composition contains.

As a method of forming the compressive stress layer, for example, there is a chemical reinforcement method of replacing ions contained in the surface layer of the inorganic composition article before setting up the compressive stress layer with cations having larger ionic radius than the ions. Furthermore, there are the thermal reinforcement method by heating and subsequently rapidly cooling the inorganic composition article, and the ion implantation method of implanting ions into the surface layer of the inorganic composition article.

In the chemical reinforcement method, the inorganic composition article is soaked in the fused (molten) salt of, for example, salts containing potassium or sodium, for example, potassium nitrate ($KNO_3$) or sodium nitrate ($NaNO_3$), or the complex salt thereof at 300 to 600° C. for 0.5 to 12 hours. Thereby, the ion-exchange reaction with cations such as potassium ions ($K^+$) or sodium ion s($Na^+$) having an ion radius larger than the lithium ion ($Li^+$) existing in the surface layer of the inorganic composition article (when the inorganic composition is crystallized glass, the surface layer of remaining glass component other than crystals) is promoted to cause a volume increase of the inorganic composition article and generate the compressive stress in the surface layer of the inorganic composition article, resulting in an increase in the ring bending strength, an indictor of the impact property.

Although the thermal reinforcement method is not particularly limited, for example, by heating the inorganic composition article at 300° C. to 600° C., and subsequently rapidly cooling it with water and/or air, the compressive stress layer generated by the temperature difference between the surface and inside of glass can be formed. Furthermore, by combining the thermal reinforcement method with the above-described chemical treatment method, the compressive stress layer can be formed more efficiently.

The ion implantation method is not particularly limited, but, for example, the desired ion(s) is(are) bombarded with accelerating energy and the accelerating voltage at a level not destroying the surface of the objective inorganic composition so as to implant the desired ion(s) into the article surface without destroying the circumference. Subsequently, as the occasion demands, the heat treatment is performed so as to be able to form the compressive stress layer in the surface layer similarly as in other methods.

In the case of a chemical reinforcement method, ions contained in the surface layer of the inorganic composition article before the compressive stress layer formation are replaced with cations having larger ion radius than the (original) ions, so that the compressive stress is generated in the surface layer by the replaced cations having a larger ion radius. For example, in the material containing excess lithium as a constituent, lithium in the top surface is replaced with ions having larger ion radius (than lithium) such as potassium ions and sodium ions, so that, as a result, the elution amount of alkali metallic ion in a water bath is reduced than that before the compressive stress layer is set up. This property is excellent in suppressing the destruction of information recording medium, especially magnetic film by alkali ion (alkali migration).

In the inorganic composition article of the present invention, supposing that the elution amount of alkali metallic ion of the article having the compressive stress layer set up in a water bath is A, and the elution amount of alkali metallic ion of the article before the compressive stress layer is set up in a water bath is B, A/B is <1, in the more preferable embodiment A/B is <0.9, and in the most preferable embodiment, A/B is <0.8.

The elution amount of alkali ion was measured by ion chromatography. Measurement conditions are as follows. Ultrapure water (80 ml) (at room temperature) and a disk-shaped inorganic composition (65 mm in diameter×0.635 mm thick) were packed in a film pack, held in a dryer warmed to about 30° C. for 3 hours, and subsequently the disk was collected and the ion chromatography measurement was performed to obtain the total amount of alkali ion (μg/disk).

Herein below, the reasons why the particle diameter, surface characteristics, physical property and composition of particles showing the crystalline phase of the inorganic composition article of the present invention were limited as described above are described.

First, regarding the crystalline phase, in order to obtain the desired surface roughness, the crystalline phase is preferably one containing at least one kind selected from the group consisting of lithium monosilicate ($Li_2SiO_3$), lithium disilicate ($Li_2Si_2O_5$), α-quartz (α-$SiO_2$), α-quartz solid solution (α-$SiO_2$ solid solution), α-cristobalite (α-$SiO_2$) or α-cristobalite solid solution (α-$SiO_2$ solid solution) having a relatively high precipitation ratio and fine globular particle shape.

Although these crystalline phases can be precipitated, for example, by the heat treatment of raw glass, they are precipitated at relatively a low heat treatment temperature, so that fine crystalline particles are precipitated, and a crystalline phase superior also in the surface property and physical characteristic can be easily obtained. Furthermore, in a relatively low temperature region of the crystallization temperature region in which the crystalline phases of the above-described lithium monosilicate ($Li_2SiO_3$) and lithium disilicate ($Li_2Si_2O_5$) coexist, the crystalline particle diameter is extremely fine, so that a remarkably superior surface roughness and ring bending strength can be obtained, and the crystalline phase is dramatically superior in the ring bending strength after the reinforcement treatment.

In order to facilitate the reduction of surface roughness after abrasive finishing and the realization of superior mechanical properties as described below, the lower limit of the existing ratio of particles showing these crystalline phases is preferably 1% in percent by mass, more preferably 3% and further more preferably 5%, and the upper limit is preferably 70%, more preferably 69% and most preferably 68%.

In this embodiment, when the inorganic composition is molded into a substrate such as disk substrate for the information recoding medium, the reduction of surface roughness (Ra) of the substrate after the abrasive finishing and the superior mechanical characteristics in the substrate after the formation of a compressive stress layer are realized. In this case, as a quantitative handling of crystal amount, the diffraction peak area was obtained from the X-ray diffraction pattern obtained by an X-ray diffraction device (Phillips, trade name: X pert-MPD) and the content was evaluated based on the calibration curve.

Furthermore, generally among the aforementioned compounds, although there is a possibility of slight alteration depending upon the temperature range, $Li_2SiO_3 < Li_2Si_2O_5 < \alpha\text{-}SiO_2$ is established as the relationship of heat expansion coefficients. Since the mean linear expansion coefficient of raw glass in this series is in the range of +60 to +120 ($\times 10^{-7 \cdot \circ} C.^{-1}$), when $\alpha\text{-}SiO_2$, etc. having a large difference in the heat expansion coefficient are precipitated a great deal, distortion between crystal and raw glass is likely to become large and influence the strength of the composition occasionally. Therefore, $Li_2SiO_3$ is a more useful crystal in that the difference in the heat expansion coefficient between raw glass and $Li_2SiO_3$ is smaller than that between raw glass and $\alpha\text{-}SiO_2$.

In the inorganic composition as a material for the inorganic composition article, if a crystalline phase having a negative mean linear heat expansion coefficient is precipitated, the inorganic composition article cannot obtain the desired mean linear heat expansion coefficient, so that it is preferable that the inorganic composition article does not contain β-quartz and a β-quartz solid solution having a negative mean linear expansion coefficient. Furthermore, in order to make the precipitated crystalline phase finer and the surface roughness more smooth, it is preferable that the inorganic composition (article) does not contain petalites including α-tridymite and Zn-petalite; wollastonite, forsterite, diopside, nepheline, clinoenstatite, anorthite, celsian, gehlenite, feldspar, willemite, mullite, corundum, rankinaite, larnite and their solid solutions, and furthermore, in order to maintain superior mechanical strength, it is preferable also to not contain tungstates including Hf-tungstate and Zr-tungstate; titanates including magnesium titanate, barium titanate and manganese titanate, mullite, dibarium trisilicate, $Al_2O_3.5SiO_2$ and their solid solutions.

Next, as to the surface characteristics, as describe above, with the improvement of the surface recording density of information recording media, the head floating height has become no more than 15 nm in recent years, and will be no more than 10 nm in the future, and thus, the recording system is advancing toward a near contact recording system or a complete contact recording system, so that in order to deal with this trend, the surface smoothness of a substrate such as a disk substrate must be better than the conventional one.

Even though a high density input-output has been attempted in the magnetic recording medium with smoothness of the conventional level, the input-output of magnetic signals cannot be performed due to a large distance between the head and medium. Furthermore, if reducing this distance is attempted, protrusions of the medium (disk substrate) and head collision may cause damages of the head and medium. Therefore, in order to not cause damages of the head and disk substrate, as well as the adsorption between the head and medium even with this extremely low floating height or in the contact state, the upper limit of the surface roughness Ra (arithmetic mean Ra) is preferably no more than 10 Å, more preferably no more than 5 Å, further more preferably no more than 4 Å, and most preferably no more than 3 Å. Moreover, in order to obtain such a smooth polished surface, the upper limit of the mean particle diameter of crystalline particles of the inorganic composition is preferably no more than 1 μm, more preferably no more than 200 nm, and most preferably no more than 150 nm. Furthermore, in order to improve the mechanical strength and heat resistance, the lower limit of the mean particle diameter of crystalline particles of the inorganic composition is preferably 1 nm.

Furthermore, the mechanical strength of the inorganic composition can be improved by evenly precipitating fine crystalline particles. Especially since the precipitated crystalline particles prevent the growth of minute cracks, fine cracks formed during the polishing processing and so on can be significantly reduced. Furthermore, it becomes possible to dramatically improve the mechanical strength and especially the ring bending strength of the inorganic composition by precipitating evenly such fine crystals and forming the compressive stress layer on the surface. From these view points, the mean particle diameter of crystalline particles is preferably in the aforementioned range.

Thus, for example, when the inorganic composition is molded into a substrate such as a disk substrate for the magnetic recording medium, the surface recording density can be increased; deflection and deformation are not generated despite rotating the substrate itself at high speed to improve the recording density; the vibration due to this high speed rotation is reduced, resulting in the decrease in the error number of data reading (TMR) due to the vibration and deflection. Furthermore, because of the superior impact resistant property, the inorganic composition exhibits superb stable behavior against head clash and substrate destruction, especially as the information recording medium in a mobile application. Herein, particles showing the crystalline phase refer to particles constituting the crystalline phase, including crystalline particles and non-crystalline particles.

Herein, the mean particle diameter of the crystalline particles refers to the median cumulative of particle diameter ("median diameter" d50) based on the area measured by a transmission electron microscope (TEM). Furthermore, the ring bending strength refers to the bending strength measured by the concentric bending method of forming a thin disk-shaped sample in the range of 65 mm in diameter and 0.635 mm in thickness, and measuring the in-plane strength of the disk-shaped sample using a circular supporting ring and a loading ring.

Next, the ring bending strength and specific gravity are described. As described above, in order to improve the recording density and data transfer speed, there is presently a trend to rotate the information recording medium disk substrate at high speed. In order to deal with this trend, the substrate material must have high stiffness and low specific gravity so as to prevent disk vibration due to the deflection during the high speed rotation. Furthermore, when the substrate material is used in mobile recording equipment such as the head contact device and the removable recording device, the substrate material must have mechanical strength, high Young's modulus and surface hardness sufficiently durable to the application. More specifically, after the formation of the compressive stress layer on the surface, the substrate material has preferably no less than 400 MPa in bending strength, and no less than 80 GPa in Young's modulus.

However, even though the substrate material has a high stiffness, when it has a high specific gravity, deflection is formed due to its high weight during the high rotation so as to generate vibration. On the contrary, even though the specific gravity is low, when the stiffness is small, vibration is similarly generated. On the other hand, if the specific gravity is lowered too far, as a result, it becomes difficult to obtain the desired mechanical strength. Therefore, the substrate material must keep a seemingly conflicting (contradictory) balance between high stiffness and low specific gravity, and the preferable range of Young's modulus(Ga)/specific gravity is no less than 30, more preferably no less than 33, and most preferably no less than 35. Furthermore, even with a high stiffness, the specific gravity must be no more than 2.7; however, when it is less than 2.2, it becomes practically impossible to obtain a substrate having the desired stiffness.

Furthermore, regarding the mean linear expansion coefficient, with the improvement of recording density, high precision is needed in positioning the magnetic head and the (recording) medium, so that the high dimensional accuracy is required for each component of medium substrate and disk. Since effects of the difference in thermal expansion coefficients between the substrate material and these components become significant, the difference in these mean linear expansion coefficients must be as small as possible. Components having thermal expansion coefficients around +90 to +100 ($\times 10^{-7}\cdot°C.^{-1}$) in the range of 25 to 100° C. are often used in small magnetic information recording media in particular, and it is considered that the substrate is also required to have a thermal expansion coefficient in this range. However, some drive makers may use materials having thermal expansion coefficients deviating from this range (about +70~ about +125 ($\times 10^{-7}\cdot°C.^{-1}$)) as a component. From the aforementioned reasons, in order to broadly deal with the quality of materials of components to be used while keeping a balance with the strength in the crystalline system of the inorganic composition of the present invention, the lower limit of the mean linear expansion coefficient is preferably no less than +50 ($\times 10^{-7}\cdot°C.^{-1}$) and the upper limit is no more than +130 ($\times 10^{-7}\cdot°C.^{-1}$) in the range of 25 to 100° C.

The inorganic composition article of the present invention is preferably a crystallized glass, in that is easy to obtain a smooth surface on crystallized glass after polishing, and also easy to obtain a high mechanical strength when the compressive stress layer is formed on the surface.

Herein below, the composition range of the inorganic composition will be described. Each component of the inorganic composition is expressed in percent by mass in terms of oxides.

Herein, "percent by mass in terms of oxides" refers to the composition in which supposing that oxides, nitrates and so on, which are used as the raw materials of the inorganic composition components of the present invention, are all degraded to change into oxides when melted, each component contained in the inorganic composition is expressed relative to the total mass of the produced oxides taken as 100 percent by mass.

The inorganic composition of the present invention is produced, for example, by melting a glass raw material having a specific composition, and after performing the molding and slow cooling, further performing the heat treatment.

A $SiO_2$ component is a very useful component which produces, by the heat treatment, lithium monosilicate, lithium disilicate, α-quartz, α-quartz solid solution, α-cristobalite and α-cristobalite solid solution, which are precipitated as a crystalline phase. However, when its content is less than 50%, the obtained precipitated crystals of the inorganic composition are unstable so that the system is likely to become coarse, and when the content exceeds 90%, the melting and molding of the inorganic composition before the heat treatment (referred to as a raw inorganic composition) are likely to become difficult, so that the lower limit of the $SiO_2$ component content is preferably 50%, more preferably 55%, and most preferably 60%, and its upper limit is preferably 90%, more preferably 85%, and most preferably 82%.

The $Li_2O$ component is a very important component which produces lithium monosilicate ($Li_2SiO_3$) and lithium disilicate ($Li_2Si_2O_5$), which are precipitated as a crystalline phase by the heat treatment of the raw inorganic composition. However, when its content is no more than 4%, the precipitation of the above-described crystals is likely to become difficult, and at the same time the melting of the raw inorganic composition is likely to become difficult, and when the content exceeds 15%, the obtained crystals are unstable and the system is likely to become coarse and its chemical resistance is also likely to be reduced, so that its lower limit is preferably no less than 4%, more preferably 5%, and most preferably 5.5%, and its upper limit is preferably 15%, more preferably 14%, and most preferably 13%.

The $Al_2O_3$ component is preferable to improve the chemical resistance and mechanical hardness of the inorganic composition. Although the type of precipitated crystal varies depending on the heat treatment conditions, even though taking various heat treatment conditions into consideration, in order to precipitate lithium monosilicate ($Li_2SiO_3$) and lithium disilicate ($Li_2Si_2O_5$) without solid solubilizing $Al_2O_3$, the upper limit of the $Al_2O_3$ component is preferably set at 20%, more preferably 15%, and most preferably 10%. Furthermore, in order to make the chemical resistance of the inorganic composition superior, the lower limit of the $Al_2O_3$ component is preferably set at 2%, more preferably 2.5%, and most preferably 3%.

MgO, CaO, BaO, SrO and ZnO components are arbitrary components to improve the melting property of the inorganic composition and at the same time prevent coarsening of the precipitated crystals, and furthermore, effective in precipitating each crystalline particle of lithium monosilicate, lithium disilicate, α-quartz, α-quartz solid solution, α-cristobalite and α-cristobalite solid solution in a globular shape as a crystalline phase. However, when contained in excess, the obtained crystals are unstable and the system is likely to become coarse, so that the content of the MgO component is preferably no more than 3%, more preferably no more than 2.8%, and most preferably no more than 2.5%. Furthermore, the content of the CaO component is preferably no more than 7%, more preferably no more than 5%, and most preferably no more than 3%. The content of the BaO component is preferably no more than 7%, more preferably no more than 6%, and most preferably no more than 5%. Furthermore, the content of the SrO component is preferably no more than 7%, more preferably no more than 6%, and most preferably no more than 5%. Moreover, the content of the ZnO component is preferably no more than 10%, more preferably no more than 8.5%, and most preferably no more than 7%.

In the present invention, the $P_2O_5$ component is a useful component functioning as a crystalline nucleus forming agent of the inorganic composition, and can be added arbitrarily. When its content exceeds 3%, the raw inorganic composition becomes opalescent and devitrifies, so that its content is preferably no more than 3%. Furthermore, when the content is less than 1%, the crystalline nucleus formation is insufficient and the precipitated crystalline phase is likely to often grow abnormally, so that the upper limit of its content is preferably 3%, and the lower limit of its content is more preferably 1%.

The $ZrO_2$ component functions, similarly as $P_2O_5$, as a useful component which not only functions as a crystalline nucleus formation agent of the inorganic composition, but also has the remarkable effects on the miniaturization of the precipitated crystals and improvement of the mechanical strength as well as chemical resistance of the material, and can be arbitrarily added. When the content of the aforementioned component exceeds 10%, the melting of the raw inorganic composition is likely to become difficult, so that its content is preferably no more than 10%, more preferably no more than 6.5%, and most preferably 6.0%.

TiO$_2$ functions, similarly as ZrO$_2$ component and P$_2$O$_5$ component, as a useful component which not only functions as a crystalline nucleus formation agent of the inorganic composition, but also has the remarkable effects on the miniaturization of the precipitated crystals and improvement of the mechanical strength as well as chemical resistance of the material, and can be arbitrarily added. When the content of the aforementioned component exceeds 5%, the melting of the raw inorganic composition is likely to become difficult, so that its content is preferably no more than 5%, more preferably no more than 4.8%, and most preferably 4.5%.

Furthermore, in order to precipitate the desired crystal, the combined content of more than any one of the aforementioned P$_2$O$_5$ component, ZrO$_2$ component or TiO$_2$ component is preferably no less than 1%, more preferably no less than 1.5%, and most preferably no less than 2%.

The K$_2$O component is an arbitrary component to improve the melting property of the inorganic composition, and at the same time prevent coarsening of the precipitated crystals, and in order to facilitate to obtain those effects, its content is preferably no more than 3.0%, more preferably no more than 2.8%, and most preferably no more than 2.6%.

Furthermore, the Na$_2$O component is an arbitrary component to improve the melting property of the inorganic composition, but when contained in excess, is likely to cause an increase in the precipitated crystalline phase and the alteration of the precipitated crystalline phase. Therefore, it can be contained in a range to not deteriorate the aforementioned properties, and the upper limit of its content is no more than 2.0%, more preferably no more than 1.5%, and most preferably no more than 1.0%.

The Sb$_2$O$_3$ component and the As$_2$O$_3$ component are added as a clarificant when melting the inorganic composition, and in order to obtain the effect as a clarificant, the sum of at least one of these components is no more than 2.0%, more preferably no more than 1.8%, and most preferably no more than 1.5%.

The Y$_2$O$_3$ component, the WO$_3$ component, the La$_2$O$_3$ component and the Bi$_2$O$_3$ component are those to improve the melting property of the inorganic composition, and at the same time promote Young's modulus of glass to higher level, and can be added arbitrarily. In order to make the desired crystal to be obtained readily, the upper limit of the respective contents of these components is no more than 3.0%, more preferably no more than 2.8%, and most preferably no more than 2.5%.

Furthermore, the PbO component is an environmentally unfavorable one, so that it is desirable to avoid its use as much as possible.

In addition, components including metallic oxides of V, Cu, Mn, Cr, Co, Mo, Ni, Fe, Te, Ce, Pr, Nd and Er colors glass are likely to deteriorate other characteristics, so that it is desirable to not substantially contain them.

Next, in order to produce the inorganic composition of the present invention, first after the raw material having the aforementioned composition is melted and subjected to hot molding and/or cold working, crystallization is performed, that is, crystalline nuclei are formed by the heat treatment of the above processed material in a temperature range with the lower limit of 450° C., preferably 480° C., and more preferably no less than 520° C., and with the upper limit of 620° C., preferably 580° C., and further more preferably 560° C. for about 1 to 20 hours, and subsequently the crystalline growth is promoted by the heat treatment in a temperature range with the lower limit of 620° C. and with an upper limit of 800° C., preferably 750° C., more preferably 685° C., and at a temperature higher than the heat treatment for about 0.5 to 10 hours.

When the crystal nuclei formation temperature becomes lower than 450° C., the nuclei are not formed so that the crystallization does not begin, while when the temperature becomes more than 620° C., the crystal growth besides the nuclei formation simultaneously occurs, so that it becomes unable to control the crystallization. Furthermore, when the temperature of the crystal growing process becomes lower than 620° C., crystals hardly grow up to those having a preferable mean linear expansion coefficient, and further, when the temperature exceeds 800° C., crystals having a low expansion property are eventually precipitated.

The crystalline phase of the inorganic composition thus crystallized by the heat treatment includes at least one kind selected from the group consisting of lithium monosilicate, lithium disilicate, α-quartz, α-quartz solid solution, α-cristobalite and α-cristobalite solid solution, has a mean particle diameter of no more than 1 μm, more preferably no more than 150 nm, and further more preferably no less than 1 nm and no more than 150 nm, evenly precipitates minute crystals, and is superior in surface roughness and mechanical strength applicable to the disk substrate for the information magnetic recording.

Furthermore, this inorganic composition crystallized by the heat treatment becomes one having the mechanical strength with a ring bending strength of no less than 300 MPa before the compressive stress is formed and the mean linear expansion coefficient in the temperature range of 25 to 100° C. having a lower limit of no less than +50 ($\times 10^{-7} \cdot °C.^{-1}$) and an upper limit is no more than +130 ($\times 10^{-7} \cdot °C.^{-1}$), preferably no more than +120 ($\times 10^{-7} \cdot °C.^{-1}$). Its Young's modulus is no less than 80 GPa and the specific gravity is no more than 2.7.

Furthermore, by wrapping the substrate including this inorganic composition crystallized by the heat treatment followed by polishing by the usual method, a smooth surface property having surface roughness Ra (arithmetic mean roughness) no more than 10 Å, more preferably no more than 5 Å, further more preferably no more than 4 Å, and most preferably no more than 3 Å is obtained. These properties are preferable for the application to disk substrate for the magnetic recording medium. Therefore, a disk substrate for the magnetic recording medium, electronic circuit board, and light disk substrate materials can be obtained. Then, the magnetic film and, as the occasion demands, the Ni—P plating or foundation layer, protective layer, lubricating film and so on are formed on this disk substrate material to obtain a information magnetic recording medium disk capable of dealing with the high density recording. Furthermore, a dielectric multi-layer film is formed on the optical filter substrate material to obtain the optical filter.

EXAMPLES

Hereinafter, the present invention is explained in more detail with reference to embodiments; however, they should not be construed as limiting the invention in any way. Inorganic compositions A to L and inorganic composition (Comparative Example) M Tables 1 to 3 show, in regards to inorganic compositions A to L of crystallized glasses, which are inorganic compositions according to the previous invention, and a crystallized glass of an inorganic composition (Comparative Example) M, a ratio of component composition, a nucleus formation temperature of a crystallized glass, a crystallization temperature, a crystalline phase, a degree of crystallinity, a mean crystalline particle diameter, a specific gravity, a value of Young's modulus, a value of Vickers hardness, a mean coefficient of linear expansion, and an elution amount of alkali ions. Herein, specific gravity is measured by the Archimedes' method, Young's modulus is measured by an ultrasonic method, Vickers hardness is measured according to JIS R1610, and mean coefficient of linear expansion is measured according to the measurement method of mean coefficient of linear expansion for optical glass near room temperature described in JOGIS (Japan Optical Glass Industrial Standard) 16-2003 by changing the temperature range to a range from 25 to 100° C.

The crystallized glasses of inorganic compositions A to L are all obtained as a glass compact by mixing a raw material such as oxide, carbonate, and nitrate in a ratio shown in Table 1 in terms of oxides, melting the mixture using an ordinary melting apparatus at temperatures from about 1200 to 1550° C., stirring the melted material to homogeneity, forming it to a disk shape, and cooling it. Furthermore, the crystallized glass of the inorganic composition M is obtained as a glass compact by mixing a raw material such as oxide, carbonate, and nitrate in a ratio shown in Table 1 in terms of oxides, melting the mixture using an ordinary melting apparatus at temperatures from about 1400 to 1600° C., stirring the melted material to homogeneity, forming it to a disk shape, and cooling it.

Subsequently, this glass compact was crystallized by heat-treatment under the nucleus formation conditions and crystallization conditions to obtain the desired crystallized glass. Then, this crystallized glass was lapped with 800# to 2000# diamond pellets for about 1 to 20 minutes, and then polished for finishing with an abrasive (cerium oxide) having a mean particle diameter of 3 μm or less for about 10 to 120 minutes.

A mean particles diameter of particles showing a crystalline phase of each crystallized glass thus obtained was determined with a transmission electron microscope (TEM). In addition, the crystalline type of each crystalline particle was identified by XRD analysis.

Subsequently, a compressive stress layer was disposed under different conditions on a substrate surface of an obtained inorganic composition article including inorganic compositions A to L or inorganic composition M. Specifically, the article was immersed in a fused salt that is potassium-containing and/or sodium-containing, for example, potassium nitrate ($KNO_3$) or sodium nitrate ($NaNO_3$) or a complex salt thereof, at temperatures from 300 to 600° C. for 0.5 to 12 hours.

Tables 4 and 5 show, regarding Example 1 to 38 and Comparative Example 1 to 12, a formation condition of compressive stress (Type of each fused salt, immersion temperature, and immersion time), a ring flexural strength, and r2/r1, which is a ratio of a ring flexural strength r1 before the formation of compressive stress layer, and a ring flexural strength r2 after the formation of compressive stress layer.

A ring flexural strength was calculated by preparing a thin disk-shaped sample of 65 mm in diameter and 0.635 mm in thickness, obtaining a breaking load by a concentric ring flexural method for measuring a in-plate strength of a disk-shaped sample using a support ring of 59 mm in diameter and a load ring of 26 mm in diameter, and using the following equation 1 from an inside diameter, an outside diameter, a disk thickness, a Poisson's ratio, and a breaking load of the disk.

$$\sigma_\theta = \frac{3P}{4\pi h^2}\left[2(1+v)\left(A + \ln\frac{a}{b}\right) + (1-v)\left(1 - B\frac{a^2}{b^2}\right)\right] \quad \text{(Equation 1)}$$

$$A = \frac{1-v}{2(1+v)} + \frac{b^2}{a^2 - b^2}\ln\frac{a}{b} \quad B = -\frac{1(1+v)}{1-v}\frac{b^2}{a^2-b^2}\ln\frac{a}{b}$$

Here, P denotes a breaking load. "a" a disk outside diameter, "b" a disk inside diameter, "h" a disk thickness, and "v" a Poisson's ratio.

A separated crystalline phase and a degree of crystallinity (existence ratio of particle showing a crystalline phase) were indentified with an X-ray diffractometer (Philips, trade name: X'pert-MPD), as well as a scanning electron microscope and an energy dispersive analyzer (Hitachi, trade name: S-4000N; Horiba, trade name: EX420).

TABLE 1

| | | Inorganic composition | | | | |
| --- | --- | --- | --- | --- | --- | --- |
| | | A | B | C | D | E |
| Glass composition (percent by mass) | $SiO_2$ | 76.1 | 76.1 | 76.1 | 67.3 | 66.7 |
| | $P_2O_5$ | 2.0 | 2.0 | 2.0 | 2.0 | 2.5 |
| | $Al_2O_3$ | 7.1 | 7.1 | 7.1 | 7.4 | 7.0 |
| | $Li_2O$ | 10.0 | 10.0 | 10.0 | 6.2 | 7.0 |
| | $K_2O$ | 1.0 | 1.0 | 1.0 | 2.0 | 2.0 |
| | $Na_2O$ | | | | | |
| | MgO | 0.8 | 0.8 | 0.8 | 2.0 | 1.5 |
| | CaO | | | | | |
| | BaO | | | | 2.5 | |
| | ZnO | 0.5 | 0.5 | 0.5 | 6.0 | 5.1 |
| | SrO | | | | 1.7 | 1.0 |
| | $ZrO_2$ | 2.3 | 2.3 | 2.3 | 2.4 | 2.0 |
| | $TiO_2$ | | | | | 3.0 |
| | $Sb_2O_3$ | 0.2 | 0.2 | 0.2 | 0.5 | 0.2 |
| | $As_2O_3$ | | | | | |
| | $Y_2O_3$ | | | | | 2.0 |
| Total | | 100 | 100 | 100 | 100 | 100 |
| $Li_2O/Al_2O_3$ | | 1.41 | 1.41 | 1.41 | 0.83 | 1.00 |
| Crystalline phase and degree of crystallinity | Lithium monosilicate | 5.0 | 7.0 | — | — | — |
| | Lithium disilicate | 1.0 | 2.0 | 28.8 | — | — |
| | α-quartz | 0.3 | 0.5 | 3.4 | — | — |
| | α-quartz solid solution | — | — | — | — | 2 |

TABLE 1-continued

|  |  | Inorganic composition | | | | |
| --- | --- | --- | --- | --- | --- | --- |
|  |  | A | B | C | D | E |
| (percent by mass) | α-cristobalite | — | — | — | — | — |
|  | α-cristobalite solid solution | — | — | — | 9.6 | 10.5 |
|  | β-quartz solid solution | — | — | — | — | — |
| Total |  | 6.3 | 9.5 | 32.2 | 9.6 | 12.5 |
| Young's modulus E (GPa) |  | 90 | 93 | 96 | 83 | 82 |
| Specific gravity d (g/cm$^3$) |  | 2.4 | 2.43 | 2.48 | 2.55 | 2.53 |
| Young's modulus/Specific gravity E/d |  | 37.50 | 38.27 | 38.71 | 32.55 | 32.41 |
| Mean coefficient of linear expansion ($\times 10^{-7} \cdot °C.^{-1}$) (25-100° C.) |  | 63 | 65 | 80 | 85 | 93 |
| Mean crystalline particle diameter (nm) |  | 10 | 20 | 40 | 10 | 10 |
| Vickers hardness (Hv) |  | 680 | 720 | 740 | 600 | 610 |
| Nucleus formation temperature (° C.) |  | 540 | 540 | 540 | 570 | 540 |
| Retention time (hr) |  | 5 | 5 | 5 | 5 | 5 |
| Crystallization temperature (° C.) |  | 645 | 660 | 685 | 690 | 710 |
| Retention time (hr) |  | 3 | 3 | 3 | 3 | 3 |
| Elution amount of alkali ions (μg/disk) |  | 2 | 2.3 | 1.8 | 0.32 | 0.54 |

TABLE 2

|  |  | Inorganic composition | | | | |
| --- | --- | --- | --- | --- | --- | --- |
|  |  | F | G | H | I | J |
| Glass composition (percent by mass) | SiO$_2$ | 69.5 | 68.7 | 67.8 | 68.0 | 75.3 |
|  | P$_2$O$_5$ | 2.2 | 2.0 | 2.5 | 2.3 | 2.0 |
|  | Al$_2$O$_3$ | 7.0 | 7.0 | 9.0 | 8.5 | 7.0 |
|  | Li$_2$O | 7.0 | 7.0 | 7.0 | 7.0 | 9.9 |
|  | K$_2$O | 2.0 | 2.0 | 2.5 | 2.5 | 2.0 |
|  | Na$_2$O |  |  |  |  |  |
|  | MgO | 1.7 | 1.7 | 2.0 | 1.5 | 0.8 |
|  | CaO |  |  |  |  |  |
|  | BaO | 1.6 | 1.6 |  | 0.5 |  |
|  | ZnO | 2.8 | 2.8 | 6.0 | 6.0 | 0.5 |
|  | SrO | 1.0 | 1.0 |  |  |  |
|  | ZrO$_2$ | 2.0 | 2.0 |  | 0.5 | 2.3 |
|  | TiO$_2$ | 3.0 | 4.0 | 3.0 | 3.0 |  |
|  | Sb$_2$O$_3$ | 0.2 | 0.2 | 0.2 | 0.2 | 0.2 |
|  | As$_2$O$_3$ |  |  |  |  |  |
|  | Y$_2$O$_3$ |  |  |  |  |  |
| Total |  | 100 | 100 | 100 | 100 | 100 |
| Li$_2$O/Al$_2$O$_3$ |  | 1.00 | 1.00 | 0.78 | 0.82 | 1.41 |
| Crystalline phase and degree of crystallinity (percent by mass) | Lithium monosilicate | — | — | — | — | — |
|  | Lithium disilicate | — | — | — | — | 28.8 |
|  | α-quartz | — | — | — | — | 2.0 |
|  | α-quartz solid solution | 2.2 | — | — | 2.4 | — |
|  | α-cristobalite | — | — | — | — | — |
|  | α-cristobalite solid solution | 10.3 | 9.3 | 10.0 | 10.8 | — |
|  | β-quartz solid solution | — | — | — | — | — |
| Total |  | 12.5 | 9.3 | 10.0 | 13.2 | 30.8 |
| Young's modulus E (GPa) |  | 83 | 83 | 83 | 85 | 102 |
| Specific gravity d (g/cm$^3$) |  | 2.49 | 2.50 | 2.43 | 2.49 | 2.46 |
| Young's modulus/Specific gravity E/d |  | 33.33 | 33.20 | 34.16 | 34.14 | 41.46 |
| Mean coefficient of linear expansion ($\times 10^{-7} \cdot °C.^{-1}$) (25-100° C.) |  | 101 | 99 | 82 | 93 | 66 |
| Mean crystalline particle diameter (nm) |  | 10 | 10 | 10 | 10 | 30 |
| Vickers hardness (Hv) |  | 610 | 600 | 590 | 610 | 720 |
| Nucleus formation temperature (° C.) |  | 570 | 570 | 520 | 570 | 540 |
| Retention time (hr) |  | 5 | 5 | 5 | 5 | 5 |
| Crystallization temperature (° C.) |  | 670 | 680 | 690 | 690 | 710 |
| Retention time (hr) |  | 3 | 3 | 3 | 3 | 3 |
| Elution amount of alkali ions (μg/disk) |  | 0.49 | 0.71 | 0.53 | 0.60 | 1.20 |

TABLE 3

| Inorganic composition | | K | L | Comparative Example M |
|---|---|---|---|---|
| Glass composition (percent by mass) | SiO$_2$ | 75.3 | 75.3 | 55 |
| | P$_2$O$_5$ | 2 | 2 | 8 |
| | Al$_2$O$_3$ | 7 | 7 | 24 |
| | Li$_2$O | 9.9 | 9.9 | 4 |
| | K$_2$O | 2 | 2 | |
| | Na$_2$O | | | |
| | MgO | 0.8 | 0.8 | 1 |
| | CaO | | | 1 |
| | BaO | | | 1 |
| | ZnO | 0.5 | 0.5 | 0.5 |
| | SrO | | | |
| | ZrO$_2$ | 2.3 | 2.3 | 2 |
| | TiO$_2$ | | | 2.5 |
| | Sb$_2$O$_3$ | 0.2 | 0.2 | |
| | As$_2$O$_3$ | | | 1 |
| | Y$_2$O$_3$ | | | |
| Total | | 100 | 100 | 100 |
| Li$_2$O/Al$_2$O$_3$ | | 1.41 | 1.41 | 0.17 |
| Crystalline phase and degree of crystallinity | Lithium monosilicate | — | — | — |
| | Lithium disilicate | 29 | 30.1 | — |
| | α-quartz | 15.6 | 34.8 | — |
| | α-quartz solid solution | — | — | — |
| (percent by mass) | α-cristobalite | — | — | — |
| | α-cristobalite solid solution | — | — | — |
| | β-quartz solid solution | — | — | 70 |
| Total | | 44.6 | 64.9 | 70 |
| Young's modulus E (GPa) | | 98 | 96 | 90 |
| Specific gravity d (g/cm$^3$) | | 2.47 | 2.48 | 2.55 |
| Young's modulus/Specific gravity E/d | | 39.68 | 38.71 | 35.29 |
| Mean coefficient of linear expansion ($\times 10^{-7} \cdot °C^{-1}$) (25-100° C.) | | 85 | 112 | 3 |
| Mean crystalline particle diameter (nm) | | 100 | 120 | 60 |
| Vickers hardness (Hv) | | 740 | 740 | 680 |
| Nucleus formation temperature (° C.) | | 540 | 540 | 700 |
| Retention time (hr) | | 5 | 5 | 10 |
| Crystallization temperature (° C.) | | 730 | 750 | 800 |
| Retention time (hr) | | 3 | 3 | 10 |
| Elution amount of alkali ions (μg/disk) | | 1.52 | 1.48 | — |

TABLE 4

| | | Type of fused salt | Immersion temperature (° C.) | Immersion time (hr) | Ring flexural strength (MPa) | r2/r1 |
|---|---|---|---|---|---|---|
| Inorganic composition A | Comparative Example 1 | — | — | — | 500 | — |
| | Example 1 | KNO$_3$ | 450 | 0.5 | 1150 | 2.3 |
| | Example 2 | KNO$_3$ | 450 | 3.0 | 3300 | 6.6 |
| | Example 3 | KNO$_3$ | 450 | 6.0 | 3220 | 6.4 |
| | Example 4 | KNO$_3$ | 450 | 12.0 | 3480 | 7.0 |
| | Example 5 | KNO$_3$ | 350 | 0.5 | 770 | 1.5 |
| | Example 6 | KNO$_3$ | 550 | 0.5 | 1050 | 2.1 |
| | Example 7 | KNO$_3$/NaNO$_3$ | 380 | 3.0 | 1940 | 3.9 |
| | Example 8 | NaNO$_3$ | 380 | 3.0 | 2280 | 4.6 |
| Inorganic composition B | Comparative Example 2 | — | — | — | 500 | — |
| | Example 9 | KNO$_3$ | 450 | 0.5 | 1050 | 2.1 |
| | Example 10 | KNO$_3$ | 450 | 3.0 | 2700 | 5.4 |
| | Example 11 | KNO$_3$ | 450 | 6.0 | 2800 | 5.6 |
| | Example 12 | KNO$_3$ | 450 | 12.0 | 3140 | 6.3 |
| | Example 13 | KNO$_3$ | 350 | 0.5 | 590 | 1.2 |
| | Example 14 | KNO$_3$ | 550 | 0.5 | 1270 | 2.5 |
| | Example 15 | KNO$_3$/NaNO$_3$ | 380 | 3.0 | 1780 | 3.6 |
| | Example 16 | NaNO$_3$ | 380 | 3.0 | 2100 | 4.2 |
| Inorganic composition C | Comparative Example 3 | — | — | — | 530 | — |
| | Example 17 | KNO$_3$ | 450 | 0.5 | 810 | 1.5 |
| | Example 18 | KNO$_3$ | 450 | 3.0 | 1460 | 2.8 |
| | Example 19 | KNO$_3$ | 450 | 6.0 | 1730 | 3.3 |
| | Example 20 | KNO$_3$ | 450 | 12.0 | 2140 | 4.0 |
| | Example 21 | KNO$_3$ | 350 | 0.5 | 630 | 1.2 |
| | Example 22 | KNO$_3$ | 550 | 0.5 | 1010 | 1.9 |
| | Example 23 | KNO$_3$/NaNO$_3$ | 380 | 3.0 | 1350 | 2.5 |
| | Example 24 | NaNO$_3$ | 380 | 3.0 | 1860 | 3.5 |

TABLE 5

| | | Type of fused salt | Immersion temperature (° C.) | Immersion time (hr) | Ring flexural strength (MPa) | r2/r1 |
|---|---|---|---|---|---|---|
| Inorganic composition D | Comparative Example 4 | — | — | — | 360 | — |
| | Example 25 | KNO$_3$ | 450 | 12.0 | 3340 | 9.3 |

TABLE 5-continued

| | | Type of fused salt | Immersion temperature (° C.) | Immersion time (hr) | Ring flexural strength (MPa) | r2/r1 |
|---|---|---|---|---|---|---|
| Inorganic composition E | Comparative Example 5 | — | — | — | 340 | — |
| | Example 26 | KNO₃ | 450 | 12.0 | 3120 | 9.2 |
| Inorganic composition F | Comparative Example 6 | — | — | — | 330 | — |
| | Example 27 | KNO₃ | 450 | 12.0 | 3010 | 9.1 |
| Inorganic composition G | Comparative Example 7 | — | — | — | 350 | — |
| | Example 28 | KNO₃ | 450 | 12.0 | 3180 | 9.1 |
| | Comparative Example 8 | — | — | — | 350 | — |
| | Example 29 | KNO₃ | 450 | 12.0 | 3400 | 9.7 |
| | Comparative Example 9 | — | — | — | 360 | — |
| | Example 30 | KNO₃ | 450 | 12.0 | 3320 | 9.2 |
| Inorganic composition J | Comparative Example 10 | — | — | — | 540 | — |
| | Example 31 | KNO₃ | 450 | 12.0 | 1970 | 3.6 |
| Inorganic composition K | Comparative Example 11 | — | — | — | 610 | — |
| | Example 32 | KNO₃ | 450 | 0.5 | 720 | 1.2 |
| | Example 33 | KNO₃ | 450 | 3.0 | 1290 | 2.1 |
| | Example 34 | KNO₃ | 450 | 6.0 | 1650 | 2.7 |
| | Example 35 | KNO₃ | 450 | 12.0 | 1830 | 3.0 |
| | Example 36 | KNO₃ | 350 | 0.5 | 680 | 1.1 |
| | Example 37 | KNO₃ | 550 | 0.5 | 880 | 1.4 |
| Inorganic composition L | Comparative Example 11 | — | — | — | 560 | — |
| | Example 38 | KNO₃ | 450 | 12.0 | 1750 | 3.1 |
| Inorganic composition M | Comparative Example 12 | — | — | — | 340 | — |
| | Comparative Example 13 | KNO₃ | 450 | 12.0 | 480 | 1.4 |

As shown in Tables 1 to 3, in regards to inorganic compositions A to L of the present invention and inorganic composition M of Comparative Example, ratios of $Li_2O$ to $Al_2O_3$ ($Li_2O/Al_2O_3$), crystalline phases, degrees of crystallinity, and mean particle diameters of particles showing a crystalline phase are different. In crystallized glasses of inorganic compositions A to C, the crystalline phases thereof including at least one crystalline phase selected from lithium monosilicate, lithium disilicate and α-quartz having a mean crystalline particle diameter of no less than 0.01 μm and no more than 0.15 μm, and all crystals are minute and in substantially spherical form.

Furthermore, in crystallized glasses of inorganic compositions D to I, the crystalline phases thereof including at least one crystalline phase selected from α-quartz, an α-quartz solid solution, α-cristobalite and an α-cristobalite solid solution having a mean crystalline particle diameter of no more than 0.05 μm, and all crystals are minute and in substantially spherical form. In crystallized glasses of inorganic compositions J to L, the crystalline phases thereof including at least one crystalline phase selected from lithium disilicate and α-quartz having mean crystalline particle diameter of no more than 0.15 μm, and all crystals are minute and in substantially spherical form. On the other hand, in a crystallized glass of inorganic composition M, the crystalline phase thereof is a β-quartz solid solution having a mean crystalline particle diameter of 0.06 μm, and all crystals are minute and in substantially spherical form.

As shown in Table 4 and Table 5, regarding Examples 1 to 37 and Comparative Examples 1 to 13, the ring flexural strengths of Examples 1 to 37 are all higher than the ring flexural strength of Comparative Examples 1 to 11.

Furthermore, in a case where a compressive stress layer was disposed under a fixed condition that a substrate was immersed in a fused salt that is potassium nitrate ($KNO_3$) at 450° C. for 12 hours, r2/r1, which is a ratio of a ring flexural strength r2 of Comparative Example 13 and a ring flexural strength r1 of Comparative Example 12, is 1.4, which is less than 2. This is because the $Li_2O/Al_2O_3$ ratio of Comparative Example M is a low 0.17, the progress of ion exchange cannot be performed smoothly, the ratio of amorphous glass, which exist in crystallized glass having a degree of crystallinity is a high 70%, is low.

On the other hand, under the same compressive stress layer formation condition, other Examples demonstrate dramatic effects in which the ratios obtained thereof are at least 3. Herein, regarding Example 4 in which a compressive stress layer was disposed in the Example A of Table 4, the ring flexural strength calculated thereof is 3,480 GPa, which is the highest of the Examples. In addition, r2/r1, which is a ratio of a ring flexural strength of Comparative Example 1 in Table 4 and a ring flexural strength of Example 4 under the same aforementioned immersion conditions, is 7.0. This is because the $Li_2O/Al_2O_3$ ratio of Example A is 1.41, the crystallinity degree is a low 6.3%, and the ratio of amorphous glass, which exists in crystallized glass, is high.

Next, in a case where the type of fused salt was changed, potassium nitrate, sodium nitrate, or a mixture of potassium nitrate and sodium nitrate at a ratio of 1 to 1 (solution volume ratio) was chosen and used.

The progress of ion exchange and a formation of a compressive stress layer can be performed smoothly by using each type of fused salt. However, according to the results of Examples 1 to 24, in a case where potassium nitrate was used as a fused salt, even for the same composition, a higher ring flexural strength was calculated for an Example in which the degree of crystallinity was low; on the contrary, for Example C where the degree of crystallinity was high, in Examples 17 to 24 where a compressive stress layer was formed, a higher ring flexural strength was calculated in a case where sodium nitrate was used as a fused salt.

When the degree of crystallinity is low, a ratio of crystalline particle that may disturb the exchange of lithium ions and potassium ions is low, and therefore the ion exchange can be performed easily; on the other side, when the degree of crystallinity is high, due to a high ratio of crystalline particles that may disturb the exchange of lithium ions and potassium ions, a tendency of an easily increased difficulty of the exchange was demonstrated clearly by the ring flexural strength. Therefore, regarding a fused salt containing sodium ions having a radius smaller than potassium ions, the degree of crystallinity thereof is partially higher. In a case where the degree of crystallinity is reaching 10%, using a fused salt containing sodium ions is suitable to deposit a compressive stress layer in a short time.

However, when considering the reduction of alkali elution, although lithium ions were substituted with potassium ions and/or sodium ions through ion exchange, the alkali elution of sodium ions is still faster because the radius of the sodium ion is smaller than the potassium ion, and therefore a fused salt containing potassium ions is more preferably used if taking a reinforcement of ring flexural strength and a reduction of alkali elution into consideration.

Furthermore, after investigating the relationship between immersion temperature and ring flexural strength when potassium nitrate ($KNO_3$) was used as a fused salt and immersion time was fixed at 0.5 hour, in each Example, a far greater ring flexural strength was calculated at 450° C. in comparison with 350° C., and an approximately equivalent or greater ring flexural strength was calculated at 550° C. in comparison with 450° C. Generally, during the ion exchange process of amorphous glass, the upper limit of immersion temperature was determined at a temperature lower than the glass transition temperature (Tg), usually in the range from 400° C. to 500° C. However, according to the aforementioned Examples, in comparison with an amorphous glass, a crystallized glass can be immersed in a fused salt at a higher temperature due to the high thermostability thereof, and in order to obtain the same ring flexural strength that is obtained by an immersion at 450° C., it is expectable to shorten the immersion time by determining an immersion temperature that is higher than 450° C.

Regarding the depth of ion exchange in a chemical reinforcement process, it is possible to investigate the amount of potassium ions and the presence or absence of sodium ions in a surface portion by performing an SEM/EDX observation. As a result, the ion exchange of the Examples reached a depth from 5 to 20 μm. Furthermore, a scanning electron microscope and an energy dispersive analyzer (Hitachi, trade name: S-4000N; Horiba, trade name: EX420) were used in the observation.

In addition, on the substrate obtained in the Examples described above, a Cr intermediary layer (80 nm), a Co—Cr magnetic layer (50 nm), and a SiC protective film (10 nm) were formed by the DC spattering method.

Subsequently, a lubricant of a perfluoropolyether type was applied (5 nm) to obtain a magnetic information recording medium.

The thus obtained magnetic information recording medium was capable of reducing a head floating height compared with that currently in use owing to the superior surface roughness thereof, and also operating an input-output of magnetic signals in a ramp loading method causing neither head damage nor medium damage, even when a signal input-output was performed while the head was in contact with the medium. Furthermore, the substrate for use as magnetic information recording medium including the inorganic composition of the present invention will show a stable bumpy shape also in a laser texture performed in a landing zone system.

Example 39

In addition, after a crystallized glass of the aforementioned inorganic composition L was lapped, polished, ion-exchanged under the same conditions of Example 38, and washed to obtain a crystallized glass substrate, a multilayer film of $TiO_2/SiO_2$, $Ta_2O_2/SiO_2$, and $Nb_2O_5/SiO_2$ was formed, respectively, on the crystallized glass substrate to fabricate an interferometric optical filter. This interferometric optical filter that has a superior thermostable center wavelength is very suitable to be used as a band-pass filter in an optical communication system.

Example 40

In addition, after a crystallized glass of the aforementioned inorganic composition C was lapped, polished, ion-exchanged under the same conditions of Example 18, and washed to obtain a crystallized glass substrate, a photosensitive resin layer was formed on the crystallized glass substrate by coating or laminating, on which a mask having a depiction of a desired pattern was attached firmly, and exposed to electromagnetic waves of which the wavelength matched with the sensitive wavelength of the photosensitive resin. Subsequently, using a predetermined developing solution to expose the exposed region when using a positive photosensitive resin or the unexposed region when using a negative photosensitive resin forming the desired pattern on the substrate. As a mask material, the photosensitive resin is capable of forming a pattern on a crystallized glass substrate by a dry process. The substrate has promise as a substrate of electronic circuitry used in biochips, patterned media, displays, etc.

The inorganic composition article of the present invention has superior heat resistance, impact characteristics and mechanical strength required to be capable of dealing with the high recording density by the coming magnetic recording systems, especially the high recording density by the perpendicular magnetic recording system, and can achieve a super-smooth surface which becomes necessary to improve the crystalline orientation of film material when forming a film so as to provide various substrates with little alkali migration. Thus, the inorganic composition article of the present invention is not only preferable for the application to a substrate for the perpendicular magnetic recording medium for HDD, but also usable as the substrate for an information recording medium, electronic circuit substrate, substrate for an optical filter and an optical filter having a dielectric multi-layer film formed on the substrate for a optical filter.

What is claimed is:
1. An inorganic composition article containing a $Li_2O$ component and an $Al_2O_3$ component in terms of oxides with a mass ratio of $Li_2O$ to $Al_2O_3$, $Li_2O/Al_2O_3$, being no less than 0.3 wherein $SiO_7$ is contained in 66.7 to 90%, the $Li_2O$ component is no less than 7.0%, a MgO component is contained in 0.8% to 3%, and a $K_2O$ component is contained in 1.0 to 3% by mass in terms of oxides, containing crystals, having a mean linear expansion coefficient of no more than +120

($\times 10^{-7}$ C$^{-1}$) in the temperature range of 25 to 100° C. and a surface being provided with a compressive stress layer.

2. The article according to claim 1, which contains, as a crystalline phase, at least one selection from the group consisting of lithium monosilicate, lithium disilicate, α-quartz, α-quartz solid solution, α-cristobalite, and α-cristobalite solid solution.

3. The article according to claim 1, wherein the compressive stress layer is formed by replacing ions contained in a surface layer with cations having a larger ion radius than the ions.

4. The article according to claim 1, wherein the compressive stress layer is formed by heating the article, followed by rapid cooling.

5. The article according to claim 1, wherein the compressive stress layer is formed by ion infusion.

6. The article according to claim 1, wherein a contained content of particles displaying a crystalline phase is at most 70% by mass.

7. The article according to claim 1, wherein a mean particle diameter of particles displaying the crystalline phase is at most 1 μm.

8. The article according to claim 1, wherein, in cases in which an elution amount of alkali metallic ion of the article, in which the compressive stress layer is arranged, in a water bath is A, and the elution amount of alkali metallic ion of the article, in which the compressive stress layer is arranged, in a water bath is B, A/B is <1.

9. The article according to claim 1, wherein a composition of the inorganic composition article before the compressive stress layer is arranged contains the percent by mass of the following components in terms of oxides:

no more than 15% of $Li_2O$; and
2% to 20% $Al_2O_3$.

10. The article according to claim 9, wherein the composition of the inorganic composition article before the compressive stress layer is arranged contains the percent by mass of the at least one oxide selected from the following group of components:

0% to 10% of ZnO;
0% to 7% of CaO;
0% to 7% of BaO;
0% to 7% of SrO;
0% to 3% of $P_2O_5$;
0% to 10% of $ZrO_2$;
0% to 5% of $TiO_2$;
0% to 2% of $Na_2O$;
and 0% to 2% of combined content of at least one selected from a $Sb_2O_3$ component and $As_2O_3$ component.

11. The article according to claim 1, wherein the inorganic composition article is crystallized glass.

12. An information recording medium comprising the inorganic composition article according to claim 11.

13. An information recording medium consisting of the article according to claim 1.

14. An electronic circuit substrate consisting of the article according to claim 1.

15. A substrate for an optical filter consisting of the article according to claim 1.

16. An optical filter comprising a dielectric multilayer film on the substrate for the optical filter according to claim 15.

17. The inorganic article according to claim 1, wherein the Young's modulus (GPa)/specific gravity is no less than 35.

* * * * *